United States Patent
Forray

(10) Patent No.: US 7,645,637 B2
(45) Date of Patent: Jan. 12, 2010

(54) METHODS FOR ASSEMBLING THIN SEMICONDUCTOR DIE

(75) Inventor: Deborah Forray, San Diego, CA (US)

(73) Assignee: Henkel Corporation, Rocky Hill, CT (US)

( * ) Notice: Subject to any disclaimer, the term of this patent is extended or adjusted under 35 U.S.C. 154(b) by 389 days.

(21) Appl. No.: 11/581,759

(22) Filed: Oct. 16, 2006

(65) Prior Publication Data

US 2009/0275171 A1    Nov. 5, 2009

(51) Int. Cl.
| H01L 21/50 | (2006.01) |
| H01L 21/48 | (2006.01) |
| H01L 21/44 | (2006.01) |
| H01L 23/52 | (2006.01) |
| H01L 23/48 | (2006.01) |
| H01L 29/40 | (2006.01) |
| H01L 23/13 | (2006.01) |

(52) U.S. Cl. .................. 438/118; 257/783; 257/782; 257/E23.04

(58) Field of Classification Search ................. 438/118; 257/782, 783, E23.04
See application file for complete search history.

(56) References Cited

U.S. PATENT DOCUMENTS

| 5,904,497 A | * | 5/1999 | Akram ................... 438/106 |
| 6,548,376 B2 | * | 4/2003 | Jiang .................... 438/459 |
| 7,056,767 B2 | * | 6/2006 | Liang et al. ............ 438/108 |

* cited by examiner

*Primary Examiner*—Luan C Thai
(74) *Attorney, Agent, or Firm*—Jane E. Gennaro

(57) ABSTRACT

The invention is based on the discovery that certain self-filleting die attach adhesives are useful in semiconductor die assemblies containing thin die. As used herein, the term "self-filleting" refers to any adhesive that when dispensed and then subjected to suitable cure conditions, will flow and fill up the area between two die or between a die and a substrate while not forming a bulky fillet that can overflow onto the top of the die. In addition, the invention is useful for tight tolerance semiconductor die assemblies, since the fillet from the die-attach adhesives employed in the methods of the invention does not cover bond fingers, thereby causing wire bond yield loss.

11 Claims, 5 Drawing Sheets

1. Draw an "X" pattern as usual
2. Lower the die to a height that the pattern spreads but not forming fillet
3. Subject the part to the standard ramp up cure process, e.g. 30 minutes 25°C to 150°C and 15 minutes at 150°C.
4. The material must flow and fill up the entire die area 1. Draw an "X" pattern as usual
2. Lower the die to a height that the pattern spreads but not forming fillet
3. Subject the part to the standard ramp up cure process, e.g. 30 minutes 25°C to 150°C and 15 minutes at 150°C.
4. The material must flow and fill up the entire die area Bondline Thickness: 32 μm Bondline Thickness: 28 μm ns, will flow and fill up the area between two die or between a die and a substrate while not forming a bulky fillet that can overflow onto the top of the die. In addition, the invention is useful for tight tolerance semiconductor die assemblies, since the fillet from the die-attach adhesives employed in the methods of the invention does not cover bond fingers, thereby causing wire bond yield loss. Moreover, when using the invention self-filleting adhesives described herein, there is no need to press the die onto the paste, thus minimizing the chance of cracking thin die during the die attach process. However, it is understood that semiconductor die may be pressed onto an invention self-filleting adhesive, depending on the package to be assembled.

METHODS FOR ASSEMBLING THIN SEMICONDUCTOR DIE

FIELD OF THE INVENTION

The invention relates generally to semiconductor assemblies containing thin die, and particularly to stacked die assemblies and methods for producing such assemblies.

BACKGROUND OF THE INVENTION

Adhesive compositions are used for a variety of purposes in the fabrication and assembly of semiconductor packages and microelectronic devices. The more prominent uses include bonding of electronic elements such as integrated circuit chips to lead frames or other substrates, and bonding of circuit packages or assemblies to printed wire boards. Adhesives useful for electronic packaging applications typically exhibit properties such as good mechanical strength, curing properties that do not affect the component or the carrier, and rheological properties compatible with application to microelectronic and semiconductor components.

Due to the ever-increasing pressure to reduce the size of semiconductor packages, there has been a recent interest in thin die, and the use of these thin die in stacked packages (i.e., at least one die stacked on top of another). These types of assemblies conserve circuit board real estate without sacrificing overall performance of a device containing such an assembly. However, the use of thin die has created challenges for the semiconductor packaging industry.

Semiconductor packaging using conventional die attach paste involves lowering a die onto a dispensed pattern of die attach paste until a fillet is formed around the die edges. Standard die attach techniques can sometimes limit the use of paste in tight tolerance packages, where the distance between fillet and bond pads on a substrate are minimal. In addition, for thin die packages conventional die attach paste tends to form bulky fillets that overflow onto the top of the die, thereby contaminating the top of the die. As a result, package assemblers of thinner die have had to use die-bonding film, which increases material cost and incurs capital equipment investment.

Moreover, when using conventional semiconductor packaging techniques, after the die is lowered onto a dispensed pattern of die attach paste, the die is typically pressed onto the paste to ensure proper bonding to a substrate. This step in the die attach process has become problematic as semiconductor die have become increasingly thin, i.e., pressure applied to thin die can crack the die. Packages containing cracked die must be scrapped, and the risk of rejected packages is multiplied when stacked die packages are assembled.

SUMMARY OF THE INVENTION

The invention is based on the discovery that certain self-filleting die attach adhesives are useful in semiconductor die assemblies, especially those containing thin die. As used herein, the term "self-filleting" refers to any adhesive that when dispensed and then subjected to suitable cure conditions, will flow and fill up the area between two die or between a die and a substrate while not forming a bulky fillet that can overflow onto the top of the die. In addition, the invention is useful for tight tolerance semiconductor die assemblies, since the fillet from the die-attach adhesives employed in the methods of the invention does not cover bond fingers, thereby causing wire bond yield loss. Moreover, when using the invention self-filleting adhesives described herein, there is no need to press the die onto the paste, thus minimizing the chance of cracking thin die during the die attach process. However, it is understood that semiconductor die may be pressed onto an invention self-filleting adhesive, depending on the package to be assembled.

In one embodiment of the invention, there are provided methods for attaching a semiconductor die to a substrate. Such methods can be performed, for example, by dispensing a self-filleting adhesive composition between the substrate and the die, and thereafter subjecting the self-filleting adhesive composition to conditions suitable to cure the adhesive composition.

In another embodiment of the invention, there are provided methods for attaching at least two semiconductor die to a substrate in a stacked arrangement. Such methods can be performed, for example, by dispensing a self-filleting adhesive composition between the substrate and each of the die, and thereafter subjecting the self-filleting adhesive composition to conditions suitable to cure the adhesive composition.

In another embodiment, there are provided methods for attaching at least two semiconductor die in a stacked arrangement. Such methods can be performed, for example, by dispensing a self-filleting adhesive composition between each of the die, and thereafter subjecting the self-filleting adhesive composition to conditions suitable to cure the composition.

In still another embodiment, there are provided methods for attaching at least two semiconductor die to a substrate in a stacked arrangement. Such methods can be performed, for example, by dispensing a self-filleting adhesive composition between the substrate and each of the die, thereby creating a bondline between the substrate and each of the die; and thereafter subjecting the self-filleting adhesive composition to conditions suitable to cure the adhesive composition.

In still another embodiment, there are provided methods for attaching thin semiconductor die to a substrate. Such methods can be performed, for example, by dispensing a self-filleting adhesive composition between the substrate and the die, and thereafter subjecting the self-filleting adhesive composition to conditions suitable to cure the adhesive composition, wherein the die has a thickness of less than about 8 mils.

In still another embodiment, there are provided methods for attaching at least two thin semiconductor die to a substrate in a stacked arrangement. Such methods can be performed, for example, by dispensing a self-filleting adhesive composition between the substrate and between each of the die, and thereafter subjecting the self-filleting adhesive composition to conditions suitable to cure the adhesive composition, wherein each die has a thickness of less than about 8 mils.

Figure 4:
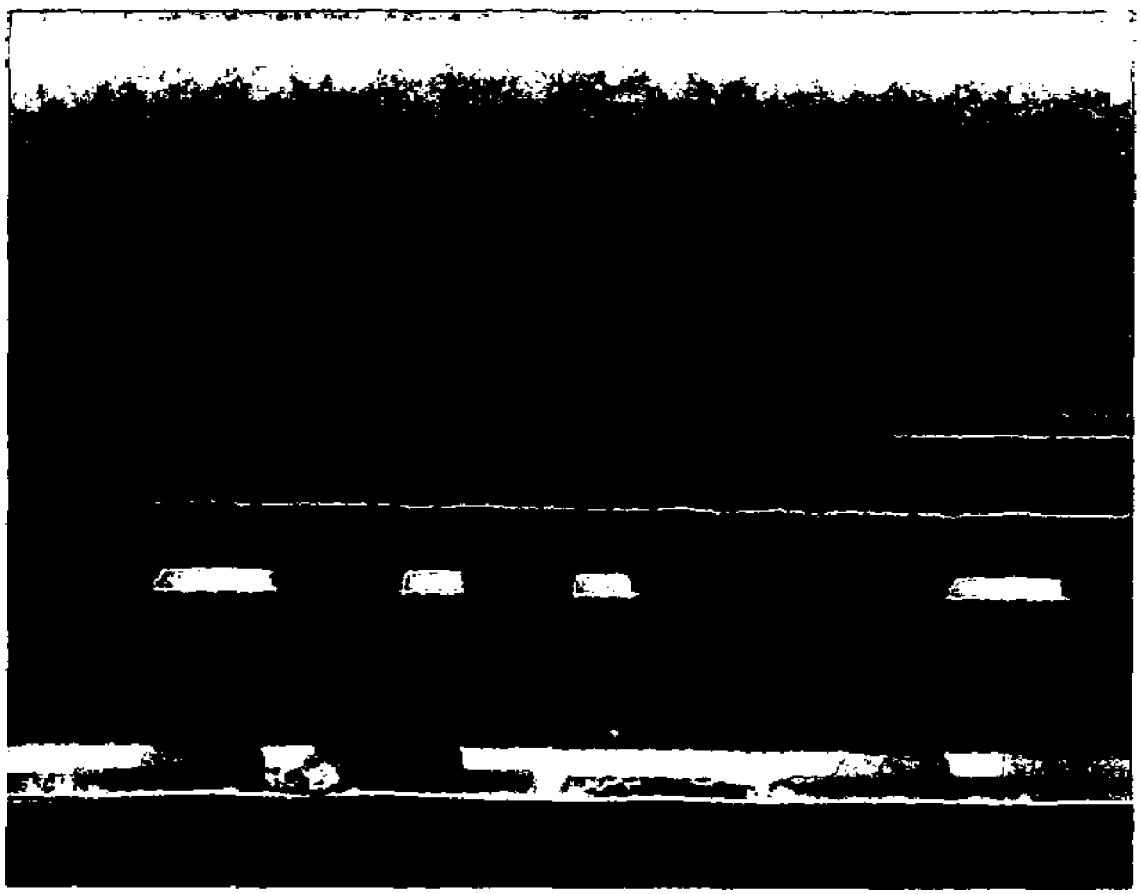

FIG. 4 illustrates an important difference between an invention self-filleting adhesive and a conventional die-attach adhesive. In the stacked die package depicted in the Figure, a conventional die-attach adhesive is dispensed between the top die and the bottom die. Note the bulky fillet between the two die. For thin die, this bulky fillet often overflows onto the top of the die and therefore contaminates the die. In contrast, a self-filleting adhesive is dispensed between the bottom die and substrate. Note that the self-filleting adhesive stops at the end of the die area, thereby minimizing any chance for adhesive overflow onto the top of the die.

Figure 5:

FIG. 5 demonstrates that invention self-filleting adhesives are compatible with spacers. FIG. 5 also demonstrates that invention self-filleting adhesives can be used to give the same properties as tape (i.e., no bulky fillet, no die-top contamination), but without incurring increased material cost and capital equipment investment.

DETAILED DESCRIPTION OF THE INVENTION

The self-filleting mechanism is based on the capillary flow of an adhesive between two parallel or semi-parallel substrates. Without wishing to be bound by theory, several factors have been identified that contribute to the self-filleting mechanism. These factors include, but are not limited to, the chemistry of the adhesive, filler effect, rheological properties, gel time of the adhesive, surface energy of the interfaces, surface tension of the adhesive, warpage of the substrate and/or die, ramp rate of cure, and the like. A single factor, or any combination of two or more factors can affect the self-filleting mechanism.

When utilizing an invention self-filleting adhesive composition in a die attach process, the volume of self-filleting adhesive dispensed between a die and a substrate (or between two die) should essentially equal the volume of air displaced between the die and substrate (or between two die). This volume can be readily calculated by those skilled in the art, based on size of the die to be used in a particular package.

The polarity of the resin or filler can play a significant role in whether an adhesive will or will not self-fillet. For example, polarity affects the flow properties on various substrates. In addition, a polar material tends not to wet or flow across a less polar substrate. Indeed, polar resin systems have been used to decrease bleed; the self-filleting mechanism can be viewed as a controlled version of resin creep or bleed.

The filler itself also plays a role in the self-filleting mechanism. Filler parameters to be considered include the type of filler, the shape of the filler, and the size of the filler, e.g., spherical vs. flake, particle size distribution, polarity of the filler, density, and the like. In addition, it has been found that percent filler loading affects self-filleting. Examples 1-3 set forth herein further describe filler effect on self-filleting.

Rheological properties are important when formulating a self-filleting die-attach adhesive. The viscosity and thixotropic index play a role in the self-filleting ability of the adhesive formulation. For example, a higher thixotropy tends to limit the flow of the adhesive. Typically, a self-filleting adhesive has a thixotropy index of less than 4. However, it is understood that adhesives having a thixotropy index of greater than 4 can also self-fillet. Those skilled in the art recognize that a material's thixotropy index is a ratio of low shear rate to high shear rate. In effect, the thixotropy index is a measure of the dispensing ability of a material, for example an adhesive, and can therefore be used to determine how well an adhesive will dispense from a container, for example from a syringe.

The gel time of an adhesive is another parameter that should be considered when developing a self-filleting adhesive. As a liquid material is heated, the viscosity drops and the material more readily flows. Indeed, the adhesive needs to flow to allow the self-filleting mechanism to occur. Adhesives with a longer gel time are generally better for the self-filleting phenomenon. If the gel time is too short, the adhesive can gel before the adhesive covers the entire die area, thereby precluding self-filleting.

In addition, without wishing to be bound by theory, it is believed that the surface energy of each interface over which the adhesive flows can also have an impact on the self-filleting phenomenon. However, to date no substrate or die coating has been identified as resistant to self-filleting.

The cure rate is also an important factor to consider regarding the self-filleting mechanism. For example, a snap curing material (i.e., a material that cure in about one minute or less) generally does not allow self-filleting to occur. Thus, in some embodiments of the invention, a typical ramp rate is 3-5° C. per minute. However, it is also understood that self-filleting can occur at room temperature if an adhesive is allowed to stage for a suitable time. The self-filleting mechanism occurs typically from about 30 minutes up to about 2 hours.

Figure 1:
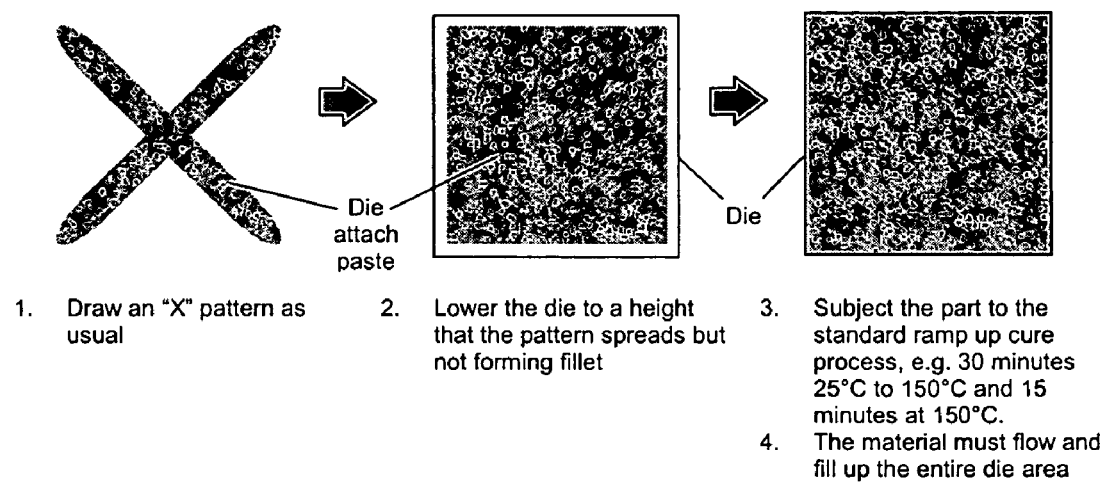
FIG. 1 depicts a typical self-filleting process. The self-filleting die attach adhesive is dispensed onto a substrate in a pattern (an "X" in this Figure); a die is then lowered onto the paste to a height so that the pattern spreads but does not form a fillet; finally, the whole assembly is subjected to suitable cure conditions, whereby the adhesive spreads to cover the entire die area without a fillet.
Figure 2:
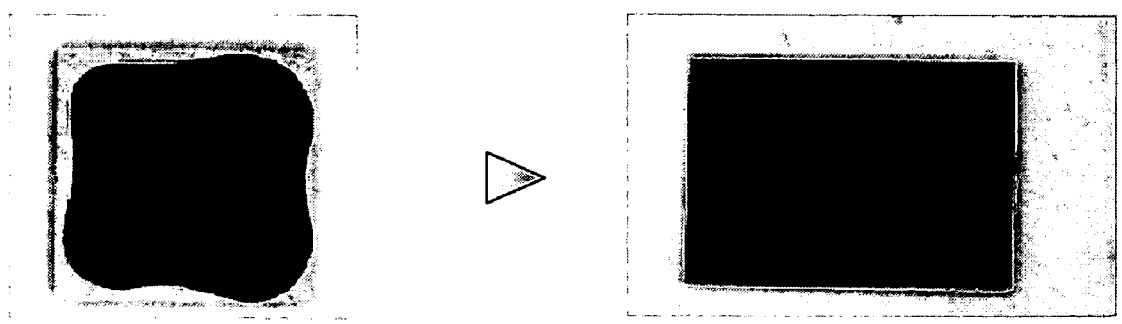
FIG. 2 demonstrates the self-filleting process through a glass slide. On the left is the adhesive distribution after initial (glass) die placement. On the right is adhesive distribution after ramp and cure. Note the even distribution of paste and uniform fillet coverage. The dispensed pattern is not perfectly symmetrical yet the area coverage is uniform after cure.
Figure 3:
FIG. 3 shows a cross-section of a package built using self-filleting methods of the invention. The die thickness is 3 mils and the die size is 8×8 mm. As shown in the Figure, the fillet height is 0% up the die wall, and the fillet spread is 34 µm, with a die tilt of 4 µm.
Figure 3:
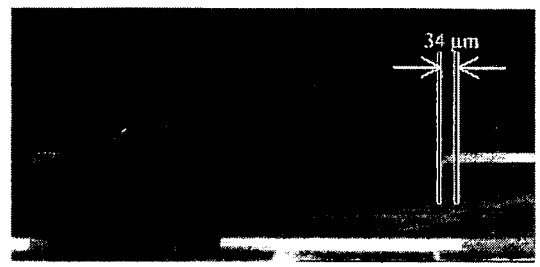

With reference especially to FIG. 3, the methods of the present invention provide packaging solutions for thin die and tight tolerance applications. Thus, invention assembly methods using self-filleting die attach pastes demonstrate that die attach pastes can continue to serve the die attach industry even for thin die applications. This results in several advantages over die attach films, such as, for example, low material costs, die attach cost does not depend on wafer yield, no tape bonding equipment investment is needed, and the service life of existing die bonders can be extended. In addition, the use of tape also requires some pressure to be applied to the die, thereby increasing the likelihood of cracking the die. FIG. 3 shows a cross-section of a thin BGA part built using self-filleting methods of the invention. The die thickness is 3 mils and the die size is 8×8 mm. As shown in FIG. 3, the fillet height is 0% up the die wall, and the fillet spread is 34 µm, with a die tilt of 4 µm.

In some embodiments, the self-filleting die attach adhesive include compounds such as maleimides, polyesters, (meth) acrylates, urethanes, epoxies, vinyl esters, olefinics, styrenics, oxetanes, benzoxazines, oxazolines, and the like In some embodiments, the self-filleting adhesives described herein require no initiator. In other embodiments, there is at least one curing initiator present in the self-filleting adhesive composition from 0.1 wt % to about 5 wt % based on total weight of the self-filleting adhesive composition. In some embodiments, the initiator is a free-radical initiator. As used herein, the term "free radical initiator" refers to any chemical species which, upon exposure to sufficient energy (e.g., light, heat, or the like), decomposes into two parts which are uncharged, but which each possesses at least one unpaired electron. Preferred free radical initiators contemplated for use in the practice of the present invention are compounds that decompose (i.e., have a half life in the range of about 10 hours) at temperatures in the range of about 70° C. up to 180° C. Exemplary free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), and the like.

The term "free radical initiator" also includes photoinitiators. For example, for invention adhesive compositions that contain a photoinitiator, the curing process can be initiated by UV radiation. In one embodiment, the photoinitiator is present at a concentration of 0.1 wt % to 5 wt % based on the total weight of the organic compounds in the self-filleting adhesive composition (excluding any filler). In a one embodiment, the photoinitiator comprises 0.1 wt % to 3.0 wt %, based on the total weight of the organic compounds in the self-filleting adhesive composition. Photoinitiators include benzoin derivatives, benzilketals, α,α-dialkoxyacetophenones, α-hydroxyalkylphenones, α-aminoalkylphenones, acylphosphine oxides, titanocene compounds, combinations of benzophenones and amines or Michler's ketone, and the like.

When the self-filleting adhesive includes an epoxy, other catalysts are contemplated for use in the practice of the invention, including for example phenols, polyphenols, anhydrides, and the like. Certain catalysts contemplated, include for example, compounds which can be employed to catalyze the reaction between a phenolic hydroxyl group and a vicinal epoxide group include, for example, tertiary amines such as, triethylamine, tripropylamine, tributylamine; 2-methylimidazole (such as, for example, the Curezol™ imidazoles available from Air Products), N-methylmorpholine, combinations thereof and the like; quaternary ammonium compounds such as, benzyl trimethyl ammonium chloride, tetrabutylammonium chloride, combinations thereof and the like; phosphines such as triphenylphosphine, tributylphosphine, trilaurylphosphine, trichlorobutylphosphine, trinaphthylphosphine, and the like; and phosphonium compounds such as, ethyltriphenylphosphonium chloride, ethyltriphenylphosphonium bromide, ethyltriphenylphosphonium iodide, ethyltriphenylphosphonium phosphate, ethyltriphenylphosphonium acetate.acetic acid complex, tetrabutylphosphonium chloride, tetrabutylphosphonium bromide, tetrabutylphosphonium iodide, tetrabutylphosphonium phosphate, tetrabutylphosphonium acetate.acetic acid complex, butyltriphenylphosphonium tetrabromobisphenate, butyltriphenylphosphonium bisphenate, butyltriphenylphosphonium bicarbonate, Lewis acids, Lewis bases, combinations thereof and the like.

In addition to the factors set forth herein, fillers contemplated for use in the practice of the present invention can act to modify the rheology of the resulting adhesive. Examples of suitable thermally conductive fillers which can be employed in the practice of the present invention include graphite, aluminum nitride, silicon carbide, boron nitride, diamond dust, alumina, and the like. Other fillers include polysiloxanes (such as polydimethyl siloxanes) silica, fumed silica, alumina, titania, calcium carbonate, and the like.

In addition, non-conductive fillers are contemplated for use in the practice of the invention. In some embodiments, the non-conductive fillers contain perfluorinated hydrocarbon polymers. In certain embodiments, the filler is polytetrafluoroethylene.

As used herein, the term "coupling agent" refers to chemical species that are capable of bonding to a mineral surface and which also contain polymerizably reactive functional group(s) so as to enable interaction with the adhesive composition. Coupling agents thus facilitate linkage of the die-attach paste to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). In some embodiments, the coupling agents contain both a co-polymerizable function (e.g., vinyl moiety, acrylate moiety, epoxy moiety, methacrylate moiety, and the like), as well as a silicate ester function. The silicate ester portion of the coupling agent is capable of condensing with metal hydroxides present on the mineral surface of substrate, while the co-polymerizable function is capable of co-polymerizing with the other reactive components of invention die-attach adhesive. In certain embodiments coupling agents contemplated for use in the practice of the invention are oligomeric silicate coupling agents such as poly(methoxyvinylsiloxane).

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive composition.

The self-filleting adhesive compositions can be dispensed onto either a semiconductor die or onto a substrate. As will be understood by those skilled in the art, the time and temperature curing profile for each adhesive composition will vary, and different compositions can be designed to provide the curing profile that will be suited to the particular industrial manufacturing process.

In certain embodiments, the adhesive compositions may contain compounds that lend additional flexibility and/or toughness to the resultant cured adhesive. Such compounds may be any thermoset or thermoplastic material having a Tg of 50° C. or less, and typically will be a polymeric material characterized by free rotation about the chemical bonds, the presence of ether groups, and the absence of ring structures. Suitable such modifiers include polyacrylates, poly(butadiene), polyTHF (polymerized tetrahydrofuran, also known as poly(1,4-butanediol)), CTBN (carboxy-terminated butadiene-acrylonitrile) rubber, polypropylene glycol, block copolymers such as Kraton, Nanostrength, and the like.

Inhibitors for free-radial cure may also be added to the adhesive compositions and die-attach pastes described herein to extend the useful shelf life of the adhesives described herein. Examples of these inhibitors include hindered phenols such as 2,6-di-tert-butyl-4-methylphenol; 2,6-di-tert-butyl-4-methoxyphenol; tert-butyl hydroquinone; tetrakis(methylene(3,5-di-tert-butyl-4-hydroxyhydrocinnamate)) benzene; 2,2'-methylenebis(6-tert-butyl-p-cresol); and 1,3,5-trimethyl-2,4,6-tris(3',5'-di-tert-butyl-4-hydroxybenzyl) benzene. Other useful hydrogen-donating antioxidants include derivatives of p-phenylenediamine and diphenylamine. It is also well know in the art that hydrogen-donating antioxidants may be synergistically combined with quinones, and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine. Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

Invention self-filleting adhesives are also entirely compatible with spacers (see FIG. 5). In particular, the self-filleting adhesives described herein are compatible with the spacers described in U.S. Application Ser. No. 60/781,615.

The following examples are intended only to illustrate the invention and should in no way be construed as limiting the invention.

EXAMPLES

Example 1

This Example illustrates the effect of filler loading on the self-filleting mechanism. A product labeled AAA3320 was prepared with two filler loadings. The cure ramp rate was 5° C./minute to 150° C. for 30 minutes. The results show that although the viscosity stayed the same, the self-filleting property was inhibited.

|  | AAA3320 | Modified 3320 |
| --- | --- | --- |
| Filler loading | 12.5% | 25.5% |
| Viscosity | 18590 | 18430 |
| Thixotropic Index | 2.8 | 3.5 |
| Self-Fillets | Yes, 100% die coverage | No, <100% die coverage |

18 × 25 × 10 mm die on glass slide

Example 2

The Experiment was performed to illustrate the effect of viscosity and percent filler loading on the self-filleting mechanism. An AAA3320 resin was used and filler loading increased. The increase in filler loading increases viscosity. The cure ramp rate was 5° C./minute to 150° C. for 30 minutes. At higher loading and higher viscosity self filleting does not occur.

|  | AAA3320 | A | B |
| --- | --- | --- | --- |
| Filler loading | 12.5% | 15.0% | 20.0% |
| Viscosity | 18590 | 22110 | 26210 |
| Thixotropic Index | 2.8 | 2.4 | 2.5 |
| Self-Fillets | Yes, 100% die coverage | No, <100% die coverage | No, <100% die coverage |

18 × 25 × 10 mm die on glass slide

Example 3

The Experiment was done to understand the factor of viscosity, percent loading, and resin effects. A Modified AAA3320 resin was used and filler loading increased. The increase in filler loading increases viscosity. The modification was an increase in reactive diluent. The cure ramp rate was 5° C./minute to 150° C. for 30 minutes. The results show that at higher loading but still fairly low viscosity self-filleting does not occur.

|  | Modified AAA3320 | A | B | C |
| --- | --- | --- | --- | --- |
| Filler loading | 12.5% | 15.0% | 20.0% | 25.0% |
| Viscosity | 10730 | 12040 | 14740 | 18430 |
| Thixotropic Index | 2.6 | 2.7 | 2.9 | 3.5 |
| Self-Fillets | Yes, 100% die coverage | Yes, 100% die coverage | No, <100% die coverage | No, <100% die coverage |

18 × 25 × 10 mm die on glass slide

While certain embodiments have been set forth to describe the invention, the invention is not limited thereto, and it will be apparent to those skilled in the art that various modifications can be applied within the spirit of the invention and scope of the claims.

What is claimed is:

1. A method for attaching a semiconductor die to a substrate or to another die in a stacked arrangement comprising dispensing a self-filleting adhesive composition between the die and the substrate or between the two dies, and thereafter subjecting the self-filleting adhesive composition to conditions suitable to cure the adhesive composition, whereby the adhesive composition flows and fills up the area between the die and the substrate or between the two dies forming a bondline but not a bulky fillet.

2. The method of claim 1, wherein the die has a thickness of less than 20 mils.

3. The method of claim 1, wherein the die has a thickness of less than 10 mils.

4. The method of claim 1, wherein the die has a thickness of less than 3 mils.

5. The method of claim 1, wherein the bondline is 0.5 mils to about 6 mils.

6. The method of claim 1, wherein the bondline is 1 to about 4 mils.

7. The method of claim 1, wherein the bondline is 1 to about 3 mils.

8. The method of claim 1, wherein the self-filleting adhesive optionally comprises a filler.

9. The method of claim 1, wherein the die is pressed onto the self-filleting adhesive after dispensing but prior to curing.

10. The method of claim 1, wherein the conditions suitable to cure the adhesive occur at a temperature ramp rate of 3-5° C. per minute to 150° C. for 30 minutes.

11. A method for attaching a semiconductor die to a substrate or to another die in a stacked arrangement comprising dispensing a self-filleting adhesive composition between the die and the substrate or between the two dies at room temperature, allowing the composition to self-fillet whereby the adhesive composition flows and fills up the area between the die and the substrate or between the two dies at room temperature, forming a bondline but not a bulky fillet, and thereafter subjecting the self-filleting adhesive composition to conditions suitable to cure the adhesive composition.

* * * * *